(12) United States Patent  
Yokotani et al.

(10) Patent No.: US 7,265,541 B1  
(45) Date of Patent: Sep. 4, 2007

(54) MAGNETIC SENSOR

(75) Inventors: Masahiro Yokotani, Tokyo (JP); Naoki Hiraoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/466,560

(22) Filed: Aug. 23, 2006

(30) Foreign Application Priority Data

Feb. 9, 2006 (JP) .......................... P2006-032532

(51) Int. Cl.
   *G01B 7/30* (2006.01)
(52) U.S. Cl. .............................. 324/207.25; 324/207.21
(58) Field of Classification Search ........... 324/207.21, 324/207.24–207.26, 165, 173; 340/672
   See application file for complete search history.

(56) References Cited

U.S. PATENT DOCUMENTS 6,252,395 B1 *  6/2001  Aoyama et al. ....... 324/207.12
6,291,990 B1 *  9/2001  Nakane et al. ......... 324/207.25
6,630,821 B2 * 10/2003  Shinjo et al. .......... 324/207.21
6,870,365 B1 *  3/2005  Yokotani et al. ....... 324/207.25

FOREIGN PATENT DOCUMENTS

JP          2002-090181 A     3/2002

* cited by examiner

*Primary Examiner*—Bot LeDynh  
(74) *Attorney, Agent, or Firm*—Sughrue Mion, PLLC (57) ABSTRACT

The magnetic sensor in the invention includes a detecting section that detects a change of magnetic flux due to a movement of the magnetic movable, comparator circuits constituting a converting section that converts a change of magnetic flux detected by the detecting section into an electric amount, and a D-FF circuit device, in a sensor unit having a power-supplying power terminal VB, a ground terminal GND and an output terminal VOUT. A current control section is provided to change the amount of current flowing through at least one of the power terminal and the ground terminal, correspondingly to a moving direction of the magnetic movable. Thus, a moving direction of the magnetic movable can be determined depending upon the amount of current.

6 Claims, 8 Drawing Sheets

FIG. 9

MAGNETIC SENSOR

BACKGROUND OF THE INVENTION

1. Technical Field of the Invention

This invention relates to a magnetic sensor that has a magnetic movable to move responsive to a movement of an object-being-detected so that a movement of an object-being-detected, particularly a direction of movement thereof, can be detected by using a change of magnetic field due to the movement of the magnetic movable.

2. Description of the Related Art

Conventionally, there is well-known a magnetic sensor adapted to detect a moving direction of an object-being-detected by moving a magnetic movable having convexes in responsive to a movement of the object-being-detected and thereby detecting a change of magnetic field caused by the movement of the magnetic movable through the use of a magneto-resistance element (hereinafter referred to as an MR element).

Such existing magnetic sensors include, say, those having a structure that three MR elements are arranged opposite to a magnetic movable through a slight gap. The MR elements are arranged in a direction of movement of the magnetic movable by inserting those MR elements respectively in two bridge circuits at predetermined sides thereof. The magnetic movable, when moved, causes a resistance change in the MR elements, which is taken as voltage change on two systems from the bridge circuits. From the state of voltage change, detected is a moving direction of the magnetic movable and hence of the object-being-detected. (see JP-A-2002-90181, FIGS. 4-6, description page 6, for example).

In the existing magnetic sensor shown in JP-A-2002-90181, the two-system voltage changes taken out of the bridge circuits are converted by first and second comparator circuits into rectangular-wave signals. One of the rectangular-wave signals is inputted to a base terminal of an output transistor and to a D-terminal of a D-flip-flop circuit. The other rectangular-wave signal is inputted to a CL terminal of the D-flip-flop circuit. The D-flip-flop circuit has an output that is inputted to a base terminal of another transistor. This transistor has a collector terminal whose voltage is pulled up to the power voltage VCC, and an emitter terminal connected to an emitter terminal of the output transistor and grounded through a resistance.

The output transistor has an output signal that is delivered to a computer unit and then pulled up to the power voltage VCC. The output signal of the output transistor is inputted to third and fourth comparator circuits where compared with comparison levels 1 and 2, to obtain two output signals based on the comparison results. In the case one output signal is in a low state in level, a forward movement is to be recognized as to the magnetic movable. When the output signal is a rectangular wave, a reverse movement is to be recognized as to the magnetic movable.

However, in the existing magnetic sensor shown in JP-A-2002-90181, one rise edge of a rectangular-wave signal is used to recognize a moving direction of the magnetic movable. Thus, there problematically encounters a delay in the timing of detecting a moving direction of the magnetic movable.

SUMMARY OF THE INVENTION

It is an object of the present invention to provide a magnetic sensor capable of correctly detecting, free from erroneous detection, a moving direction of a magnetic movable without a significant delay in timing of detecting a moving direction of the magnetic movable.

A magnetic sensor in the invention is a magnetic sensor having a sensor unit, comprising: a magnetic movable that moves in response to a movement of an object-being-detected; a sensor section provided opposite to the magnetic movable through a gap and for detecting a change of magnetic field in the gap due to a movement of the magnetic movable; a converting section that converts a change of magnetic field, detected by the sensor section, into a change of electric amount and outputs a change of electric amount converted; and a determining section that determines a moving direction of the object-being-detected depending upon an output of the converting section; the sensor unit having a power terminal to supply power to the detecting section and converting section, a ground terminal for grounding, and an output terminal that outputs the output to the determining section; the magnetic sensor further comprising a current control section that controls an amount of current flowing through at least one of the power terminal and the ground terminal, correspondingly to a moving direction of the magnetic movable; the determining section detecting a moving direction of the object-being-detected depending upon the amount of current.

In the magnetic sensor in the invention, the current control section is structured by a switching section which is connected between the power terminal and the ground.

According to the magnetic sensor in the invention, there is provided a current control section that changes an amount of current flowing through at least one of the power terminal and the ground terminal, correspondingly to a moving direction of the magnetic movable so that a moving direction of the object-being-detected can be determined depending upon the change amount of current. Accordingly, even when the magnetic movable is inverted in rotation in any timing, a moving direction of the magnetic movable can be detected correctly, without a significant delay, in a manner free from erroneously recognizing a moving direction thereof.

Meanwhile, in the magnetic sensor of the invention, the current control section is configured by a switching section connected between the power terminal and the ground. With a simple structure, even when the magnetic movable is inverted in rotation in any timing, a moving direction of the magnetic movable can be detected correctly, without a significant delay, in a manner free from erroneously recognizing a moving direction thereof.

DESCRIPTION OF THE PREFERRED EMBODIMENTS

Basic Art of the Invention

First of all, description is now made on a magnetic sensor forming the basis of the invention. The magnetic sensor, forming the basis of the invention, uses rise and fall edges of two rectangular-wave signals in detecting a moving direction of a magnetic movable. This can detect a moving direction of the magnetic movable nearly four times faster the existing one in the foregoing. When the MR element and the magnetic movable are in a particular opposite position at a time the magnetic movable is inverted in its moving direction, a reverse rotation of the magnetic movable is detected by the edge next to the first rise or fall edge.

Figure 1:
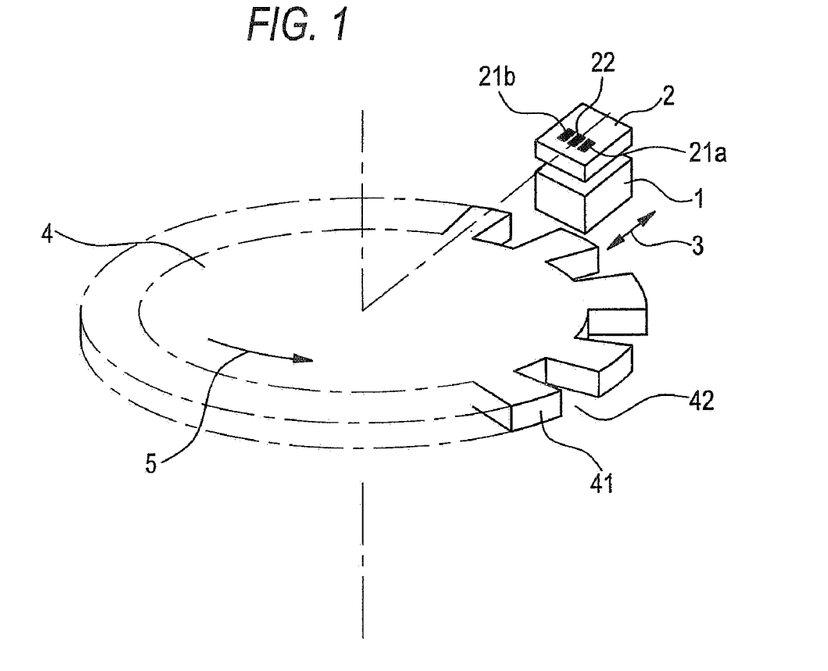
FIG. 1 is a perspective view showing an arrangement of a magnetic movable and MR elements, in an art forming the basis of the present invention.
Figure 2:
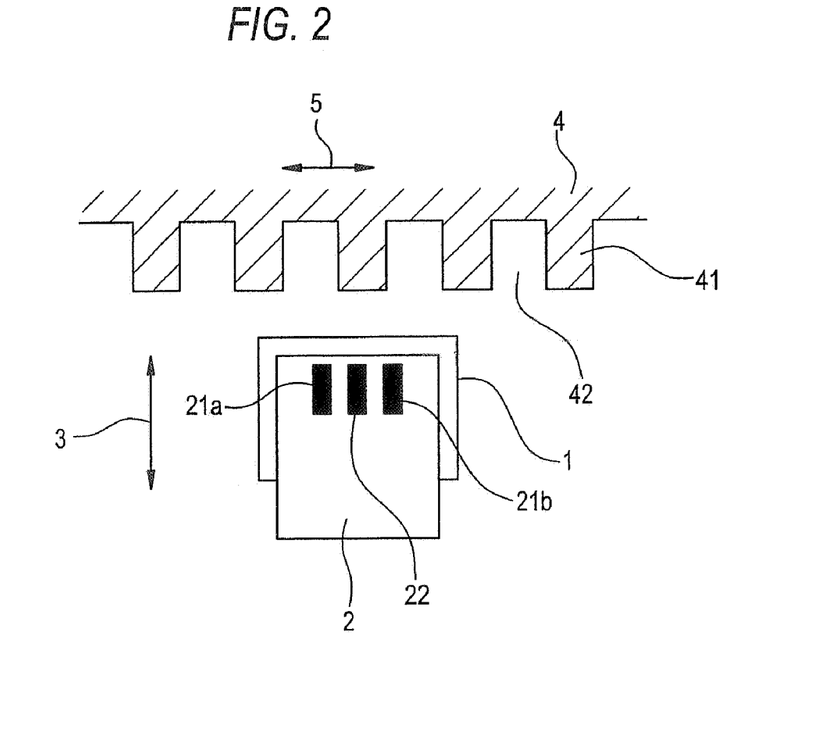
FIG. 2 is an explanatory view showing the arrangement of a magnetic movable and MR elements, in the art forming the basis of the invention.
Figure 3:
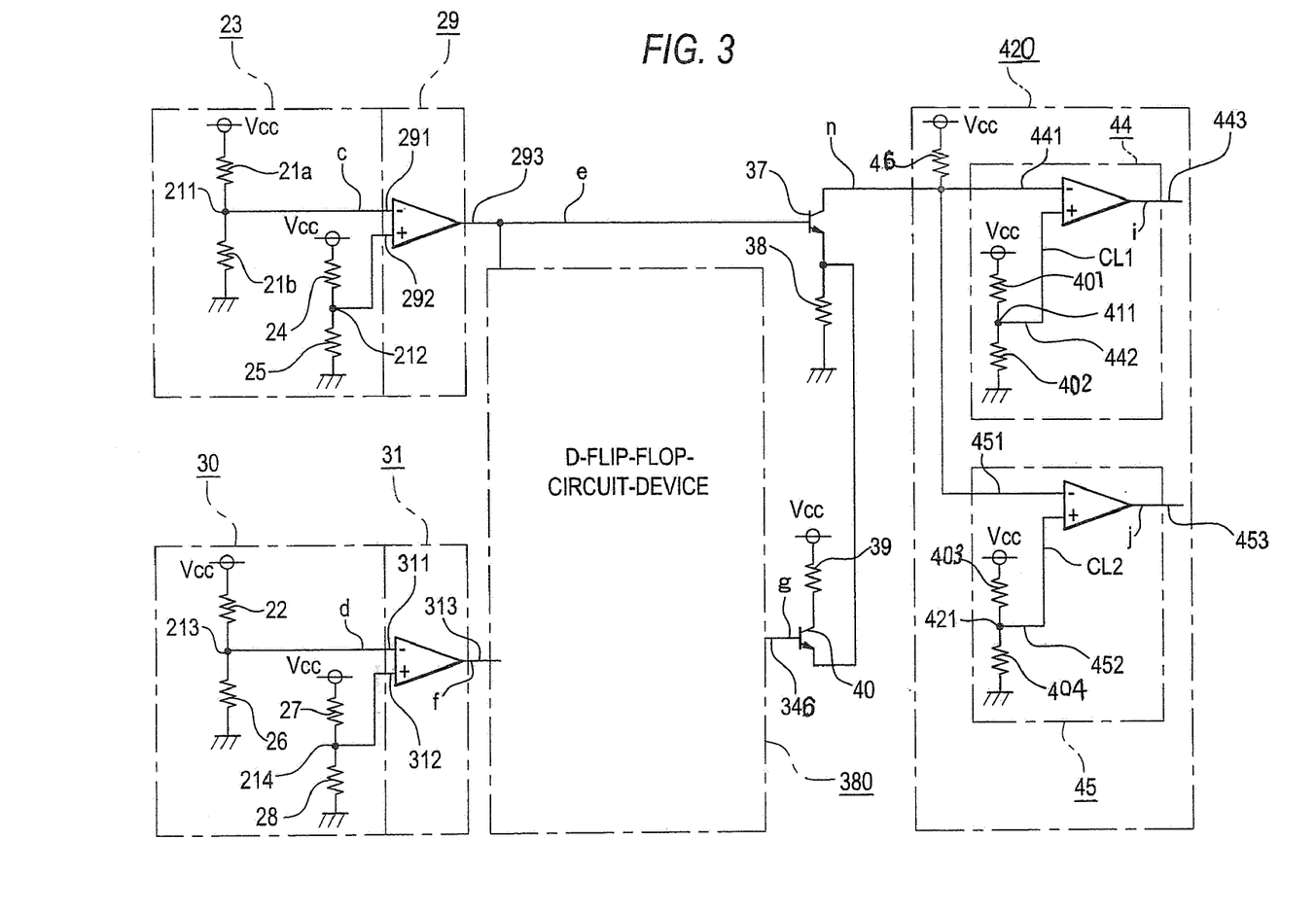
FIG. 3 is a circuit diagram of an art forming the basis of the invention.
Figure 4:
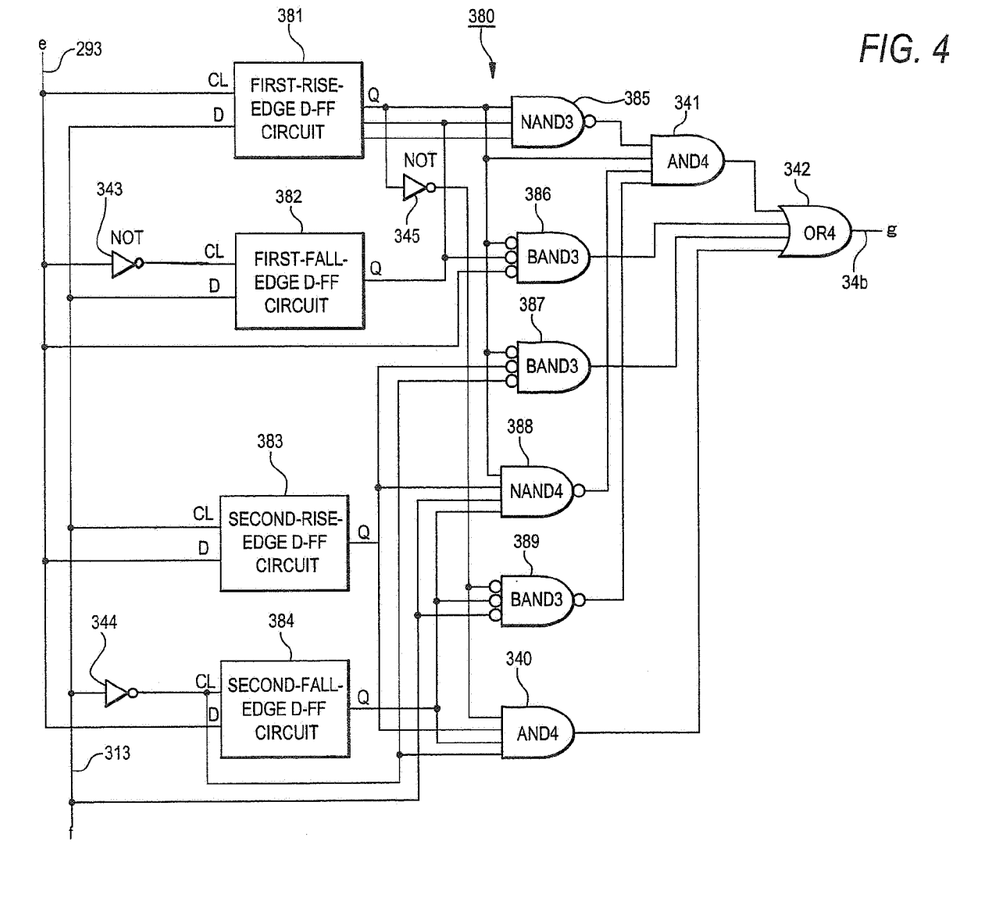
FIG. 4 is a circuit diagram of a D-flip-flop circuit device of the art forming the basis of the invention.

FIG. 1 is a perspective view showing an arrangement of a magnetic movable and MR elements, in an art forming the basis of the invention. FIG. 2 is an explanatory view of the same. FIG. 3 is a circuit diagram of a magnetic sensor. FIG. 4 is an explanatory figure of the operation of the same. In FIGS. 1 and 2, on the top surface of a magnet 1 causing a bias magnetic field, there is provided an IC chip 2 integrally structured with MR elements 21a, 21b, 22, or three magnetic detecting elements, constituting a sensor section. The magnet 1 is magnetized in a direction of arrow 3. As for a magnetic movable 4 having a multiplicity of convexes 41 equally spaced in a periphery thereof, its rotation in a direction of arrow 5 is taken forward while its rotation in a direction reverse thereto is taken reverse. The magnetic movable 4 is arranged to rotate correspondingly to a rotation of an object-being-detected (not shown).

The magnetic movable 4 is arranged such that its peripheral surface is opposed to a side surface of the magnet 1 through a slight gap. Due to the rotation of the magnetic movable 4, the convex 41 and the concave 42 alternately come close to the magnet 1. This causes a change in the magnetic field applied from the magnet 1 to the MR elements 21a, 21b, 22. The change in the magnetic field provides resistance changes in the respective MR elements 21a, 21b, 22, which are to be detected as voltage changes as described later. Incidentally, the MR elements 21a, 21b, 22, of course, may be huge magneto-resistance effect elements (GMR elements).

Referring to FIG. 3, a first bridge circuit 23 is configured by MR elements 21a, 21b and resistances 24, 25. The MR elements 21a, 21b have a connection point 211 connected to an inverted input terminal 291 of a first comparator circuit 29, as a first comparator section. The resistances 24, 25 have a connection point 212 connected as a reference voltage to an non-inverted input terminal 292 of the first comparator circuit 29. It is assumed that the signal to be inputted to the inverted input terminal 291 of the first comparator circuit 29 is "c" while the signal on an output terminal 293 thereof is "e".

A second bridge circuit 30 is configured by an MR element 22 and resistances 26, 27, 28. The MR element 22 and the resistance 26 have a connection point 213 connected to an inverted input terminal 311 of a second comparator circuit 31 as a second comparator section. The resistances 27, 28 have a connection point 214 connected as a reference voltage to an non-inverted input terminal 312 of the second comparator circuit 31. Meanwhile, in the first and second bridge circuits 23, 30, the MR elements 21a, 22 and the resistances 24, 27 are connected to a power source VCC while the MR element 21b and the resistances 25, 26, 28 are grounded. It is assumed that the signal to be inputted to the input terminal of the second comparator circuit 31 is "d" while the signal at an output terminal 313 is "f".

A D-flip-flop circuit device (hereinafter referred to as a D-FF circuit device) 380 is configured as shown in FIG. 4. Namely, in FIG. 4, it has a first rise-edge D-flip-flop circuit (hereinafter referred to as a first rise-edge D-FF circuit) 381, a first fall-edge D-flip-flop circuit (hereinafter referred to as a first fall-edge D-FF circuit) 382, a second rise-edge D-flip-flop circuit (hereinafter referred to as a second rise-edge D-FF circuit) 383, and a second fall-edge D-flip-flop circuit (hereinafter referred to as a second fall-edge D-FF circuit) 384.

The first rise-edge D-FF circuit 381 has a CL terminal connected to an output terminal 293 of the first comparator circuit 29, and a D terminal connected to an output terminal 313 of the second comparator circuit 31. The second rise-edge D-FF circuit 383 has a CL terminal connected to an output terminal 313 of the second comparator circuit 31, and a D terminal connected to an output terminal 293 of the first comparator circuit 29. The first fall-edge D-FF circuit 382 has a CL terminal connected to the output terminal 293 of the first comparator circuit 29 through a NOT circuit 343, and a D terminal connected to the output terminal 313 of the second comparator circuit 31. The second fall-edge D-FF circuit 384 has a CL terminal connected to the output terminal 313 of the second comparator circuit 31 through a NOT circuit 344, and a D terminal connected to the output terminal 293 of the first comparator circuit 29.

The first and second rise-edge D-FF circuits 381, 383 are well-known D-flip-flop circuits. When the input signal to the CL terminal is low in level, the output terminal Q maintains the current output state regardless of the level of a signal inputted to the D terminal. When a high-level signal is inputted to the CL terminal, triggering is effected by its rise edge. When the signal to the D terminal is high in level, the output terminal Q has a high-level signal while, when the signal to the D terminal is low in level, the output terminal Q has a low-level signal.

The first and second fall-edge D-FF circuits 382, 384 are well-known D-flip-flop circuits. When the input signal to the NOT circuit 343, 344 connected to the CL terminal is high in level, i.e. when the input signal to the CL terminal is low in level, the output terminal Q maintains the current output state regardless of the level of a signal inputted to the D terminal. When a low-level signal is inputted to an input terminal of the NOT circuit 343, 344 connected to the CL terminal, triggering is effected by its fall edge, i.e. by the rise edge of a high-level signal inputted to the CL terminal. When the signal to the D terminal is high in level, the output terminal Q has a high-level signal while, when the signal to the D terminal is low in level, the output terminal Q has a low-level signal.

The respective Q terminals, of the first and second rise-edge and fall-edge D-FF circuits 381, 382, 383, 384, are connected to a 4-input OR circuit 342 through a logic circuit formed by a 3-input NAND circuit 385, 3-input BAND circuits 386, 387, a 4-input NAND circuits 388, a 4-input BNAND circuit 389 and 4-input AND circuits 340, 341, as shown in the figure. The 4-input OR circuit 342 has an output terminal 346 connected to a base of a second transistor (hereinafter referred to as a second Tr) 40 shown in FIG. 3. It is assumed that the 4-input OR circuit 342 has a signal "g" at its output terminal 346.

Referring back to FIG. 3, a first, or output, transistor (hereinafter referred to as a first Tr) 37 has a base connected to the output terminal 293 of the first comparator circuit 29, and an emitter grounded through a resistance 38. The second Tr 40 has a base connected to an output terminal 346 of the 4-input OR circuit 342 shown in FIG. 4, an emitter connected to a connection point of the emitter of the first Tr 37 and the resistance 38, and a collector connected to a power source VCC through a resistance 39.

A computer unit 420 has third and fourth comparator circuits 44, 45 whose inverted input terminals 441, 451 are both connected to the power source VCC through a resistance 46. The third comparator circuit 44 has a non-inverted input terminal 442 connected to a connection point 411 of the resistances 401, 402 while the fourth comparator circuit 45 has a non-inverted input terminal 452 connected to a connection point 421 of the resistances 42, 43. The resistances 401, 403 are connected to the power source VCC while the resistances 402, 404 are grounded. It is assumed that the signal inputted to the inverted input terminal 441, 451 of the third and fourth comparator circuit 44, 45 is "h", the signal on the output terminal 443 of the third comparator circuit 44 is "i", and the signal on the output terminal 453 of the fourth comparator circuit 45 is "j".

Figure 5:
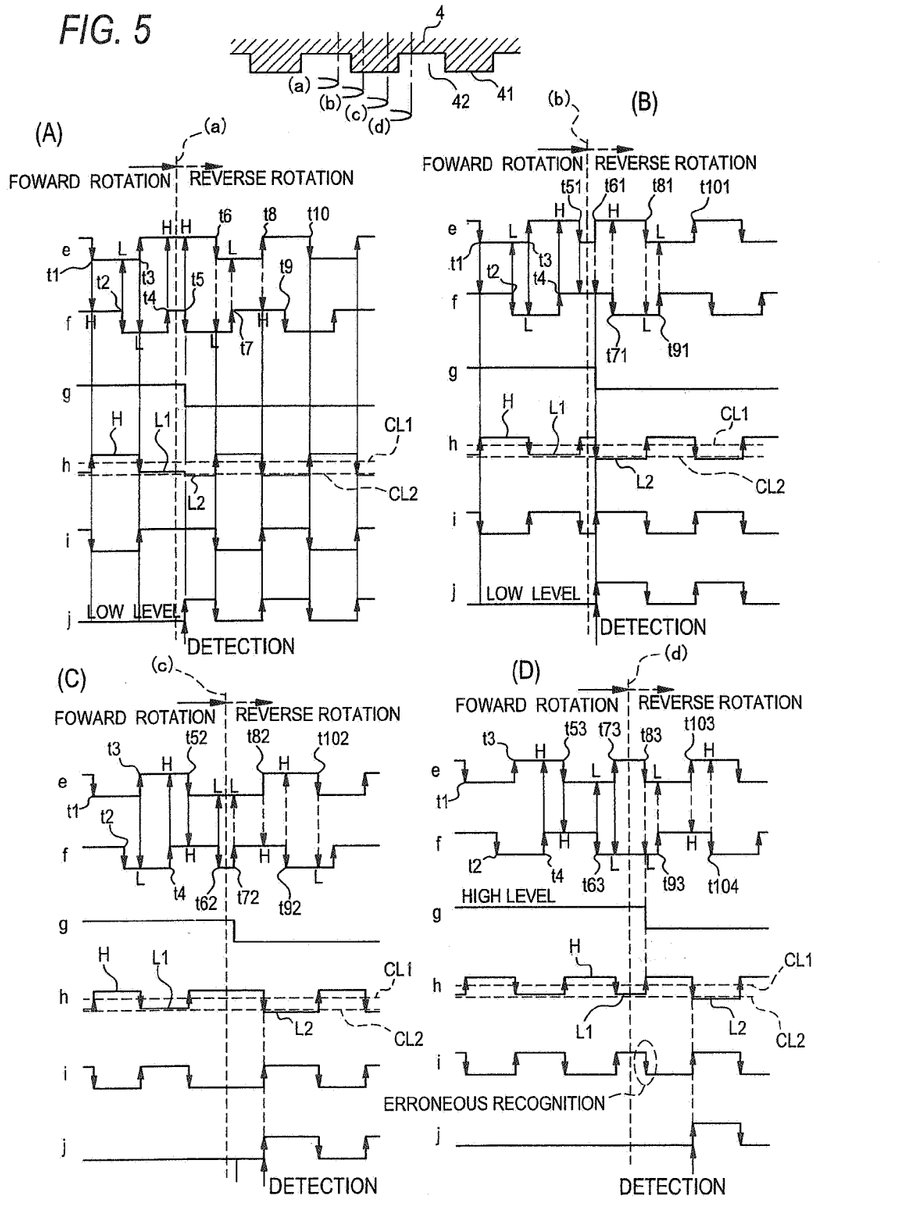
FIGS. 5A-5D are explanatory figures that explain the operation of the art forming the basis of the invention.

The operation is now described. FIG. 5A shows the waveforms of signals e, f, g, h, i, j on the respective terminals of the circuit shown in FIGS. 3 and 4 in the case rotation is switched from reverse to forward when the magnetic movable 4 and the MR element 22 in the center of the magnet 1 (see FIG. 1) are relatively opposite in a position (a). Likewise, FIGS. 5B, 5C and 5D show the waveforms of the signals e, f, g, h, i, j in the case rotation is switched from forward to reverse when the magnetic movable 4 and the center MR element 22 of the magnet 1 are relatively opposite in a position (b), (c) or (d). The signal h is given a binary-signal pulse having high and low levels H, L1 at a forward rotation of the magnetic movable 4, and a binary-signal pulse having high and low levels H, L2 at a reverse rotation of the magnetic movable 4.

Referring to FIG. 5A, when the magnetic movable 4 rotates forward, the magnetic movable 4 at its convex 41 and concave 42 alternately becomes opposite to the MR element 21a, 22 and 21b differently in time in the order. This provides a change in the bias magnetic field to each of the MR elements 21a, 22, 21b and hence a change in the resistance thereof.

The resistance change of the MR element 21a, 22, 21b causes a change in the signal c, d, to be inputted to the inverted input terminal 29, 31 of the first and second comparator circuit 291, 311, into a sinusoidal waveform. When the magnetic movable 4 rotates forward, the signal c is advanced a predetermined amount of phase relative to the signal d due to a positional relationship in arrangement of the MR elements 21a, 22, 21b.

In FIG. 5A, if it is now assumed that the signal e at time t1 changes from the high to low level, the first fall-edge D-FF circuit 382 is triggered. Because the signal f, inputted to its D terminal from the second comparator circuit 29, is high in level, its Q terminal has a signal high in level. Thus, the 4-input OR circuit 342 at its output terminal 346 has a signal g high in level.

This places the second Tr 40 in conduction and the first Tr 37 in non-conduction. As a result, the first Tr 37 has a collector signal h high in level. The third comparator circuit 44 has a comparison level CL1 given between the high and low levels H, L1 of the signal h while the fourth comparator circuit 45 has a comparison level CL2 given between the low and low levels L1, L2 of the signal h. Accordingly, at the time t1, the third comparator circuit 44 has an output signal i low in level while the fourth comparator circuit 45 has an output signal j staying low in level.

At time t2, the signal f, on the output terminal 313 of the second comparator circuit 31, falls from the high to low level, to cause a triggering in the second fall-edge D-FF circuit 384. The signal e, on the output terminal 293 of the first comparator circuit 29, is low in level at the time t2 so that the Q terminal has a signal low in level. However, the Q terminal of the first fall-edge D-FF circuit 382 maintains the high level, and the 4-input OR circuit 342 has an output g high in level. Accordingly, the third and fourth comparator circuits 44, 45 have output signals i, j staying low in level.

At time t3, the signal e of from the first comparator circuit 29 rises to cause a triggering in the first rise-edge D-FF circuit 381. However, because the signal f, on the output terminal 313 of the second comparator circuit 31, is low in level, the Q terminal has a signal low in level. At the time t3, the first fall-edge D-FF circuit 382 has, at its Q terminal, a signal maintained high in level, and the 4-input OR circuit 342 has, at its output terminal 346, a signal g high in level. For this reason, the second Tr 40 stays conductive. Meanwhile, the first Tr 37 becomes conductive because the signal e becomes high in level. Through the resistance 38, there is caused an additional flow of a current supplied from the second Tr 40, which makes the signal h low level L1.

By turning the signal h to a low level L1, the third comparator circuit 44 whose comparison level is set at the first comparison level CL1 has an output signal i high in level. Because the fourth comparison circuit 45 has a comparison level given at the second comparison level CL2, its output signal j stays low in level.

At time t4, when the signal f on the output terminal 313 of the second comparator circuit 31 rises to a high level, the second rise-edge D-FF circuit 383 is triggered. Because the signal on the D terminal at that time is high in level, a high-level signal is outputted from the Q terminal. Due to this, the 4-input OR circuit 342 has an output signal g maintained high in level, and the second Tr 40 continues conductive. For this reason, the signal h stays low level L1. Thus, at the time t4, there is no change in the output signals i, j of the third and fourth comparator circuits 44, 45 from those at the time t3.

In this manner, when the magnetic movable 4 rotates forward, the third comparator circuit 44 has an output signal i assuming a binary-signal pulse having high and low levels whereas the fourth comparator circuit 45 has an output signal j staying low in level. Namely, by the fact that the output signal i appears as a binary pulse having high and low levels while the output signal j continues low in level, it can be determined that the magnetic movable 4 is in a forward rotation.

It is now assumed that, when the magnetic movable 4 and the MR element 22 provided in the magnet 2 are in a positional relationship (a), in case the magnetic movable 4 changes from the forward to reverse rotation, the signal f on the output terminal 313 of the second comparator circuit 31 changes into a low level at time t5 that the MR element 21b first becomes opposite to the convex 41 of the magnetic movable 4. Due to this, the signal g on the output terminal 346 of the 4-input OR circuit 342 changes into a low level. The second Tr 40 becomes non-conductive and the signal h turns into a low level L2. This changes, to a high level, the signal j on the output terminal 453 of the fourth comparator circuit 45.

When the magnetic movable 4 rotates reverse, the magnetic movable 4 at its convex 41 and concave 42 alternately becomes opposite to the MR element 21b, 22 and 21a differently in time in the order, conversely to the forward rotation. At time points t6, t8 and t10 after the time point t5, the signal j on the output terminal 453 of the fourth comparator circuit 45 becomes changing alternately between low and high levels synchronously with the signal i on the output terminal 443 of the third comparator circuit 44. Accordingly, by the fact that the output signal j changes alternately between low and high levels, it can be determined that the magnetic movable 4 is in a reverse rotation.

Namely, where rotation is reversed in the positional relationship (a) in FIG. 5A, the signal h changes into an L2 level at time t5 the signal f first changes and the signal j changes from the low to high level. Accordingly, reverse rotation is to be immediately detected at time t5 that the signal f first changes. Likewise, where rotation is reversed in the positional relationship (b), the signal h becomes L2 at time t61 the signal e first changes, as shown in FIG. 5B. At the time t61, reverse rotation is immediately detected. Where rotation is reversed in the positional relationship (c), the signal h becomes L2 at time t82 that the signal e first changes, as shown in FIG. 5C. At the time t82, a reverse rotation can be detected.

Nevertheless, where the magnetic movable 4 in a positional relationship (d) rotates reverse, the signal h does not change in level to L2 at any of time points t83, t93 that the signal e, f first changes after a reverse rotation, as shown in FIG. 5D. For this reason, detection is possibly erroneous at time t83 that reverse rotation can be detected in the normal case, thus making impossible to detect a reverse rotation. It is impossible to detect a reverse rotation before the time point t103 the signal h changes in level to L2.

First Embodiment

Figure 6:
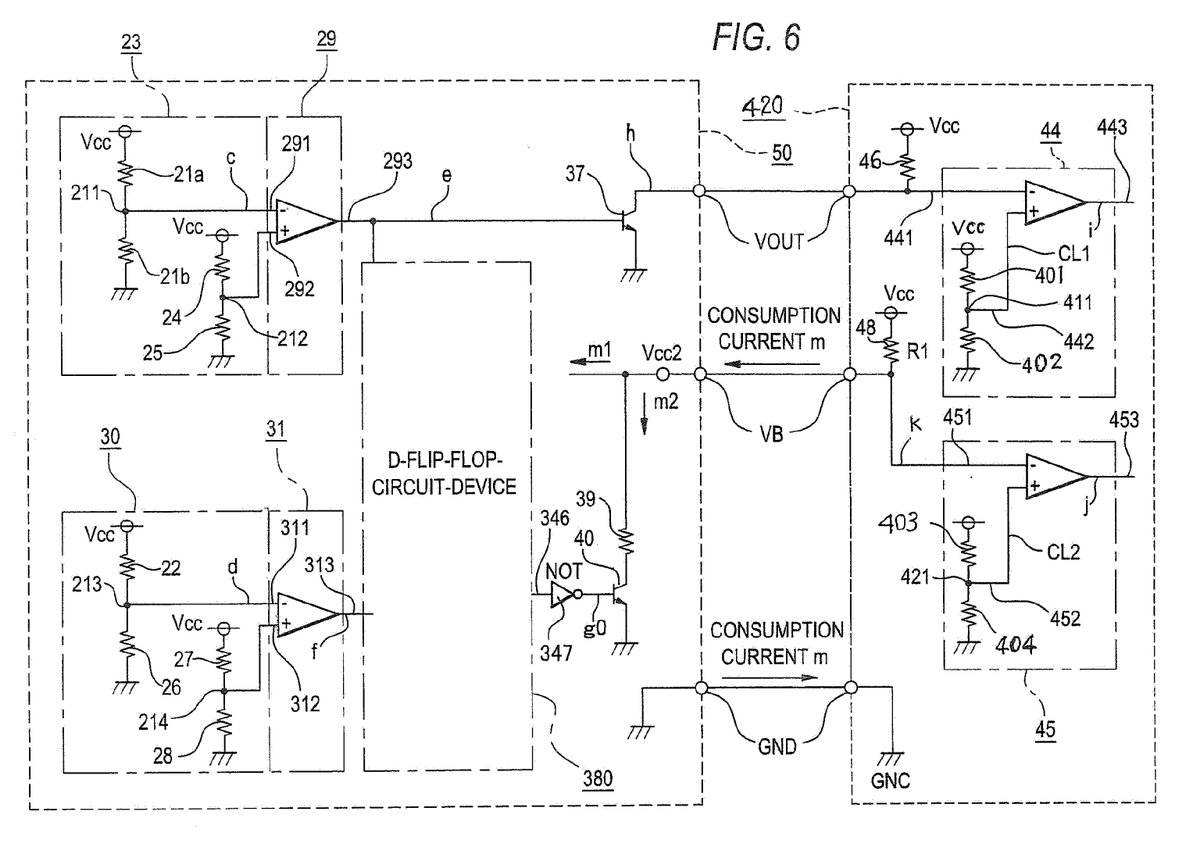
FIG. 6 is a circuit diagram of a device according to a first embodiment of the invention.

FIG. 6 shows a circuit diagram of a magnetic sensor according to a first embodiment of the invention. FIGS. 7A-7D are explanatory figures that explain the operation of the same. In FIG. 6, like or corresponding elements to those in the foregoing art forming the basis of the invention are attached with the like numerals. In FIG. 6, a D-FF circuit device 380 has the same configuration as the showing in FIG. 4, thus having an output terminal 346 connected to a base of a second Tr 40 through a NOT circuit 347. The collector of the second Tr 40 is connected through a resistance 39 to a power terminal VB through which power is supplied from a computer unit 420 to a sensor unit 50. The sensor unit 50 has a power source VCC2 free from voltage fluctuations because of the voltage from the power terminal VB regulated to a predetermined value.

The sensor unit 50 is supplied with power from the computer unit 420 through the power terminal VB so that a consumption current m flows to the sensor unit 50. The consumption current m includes a current m1 flowing to the circuit elements of the sensor unit 50 and a current m2 to be controlled by the second Tr 40. Meanwhile, the consumption current m flows from the sensor unit 50 to the computer unit 420 through a GND terminal.

A first Tr 37 has an emitter grounded and a collector connected to an inverted input terminal 441 of a third comparator circuit 44 of the computer unit 42 through an output terminal VOUT of the sensor unit 50. The first Tr 37 has an output signal h that is conveyed to the computer unit 420 and then pulled up to the power voltage VCC.

A fourth comparator circuit 45 has an inverted input terminal 451 connected to a collector of the second Tr 40 of the sensor unit 50 through the power terminal VB and resistance 39. The inverted input terminal 451 is connected to the power source VCC through a resistance 48. The resistance 48 is assumed having a resistance value R1. The ground terminal GND is directly grounded without intervening a resistance. When the second Tr 40 is placed in conduction and the consumption current m is in an increased level, signal k is high in level. When the second Tr 40 is placed in non-conduction and the consumption current m is in a decreased level, signal k is low in level. Namely, the following is held:

signal-k high level $H=VCC-(R1 \times m1)$ signal-k low level $L=VCC-\{R1 \times (m1+m2)\}$.

In the first embodiment of the invention, the magnetic detecting elements 21a, 21b, 22 constitute a detecting section in the invention. The first and second bridge circuits 23, 31, the first and second comparator circuits 29, 31 and the D-flip-flop circuit device 380 constitute a converting section in the invention. The third and fourth comparator circuits 44, 45 constitute a determining section in the invention. The second Tr 40 constitutes a current control section in the invention.

Figure 7:
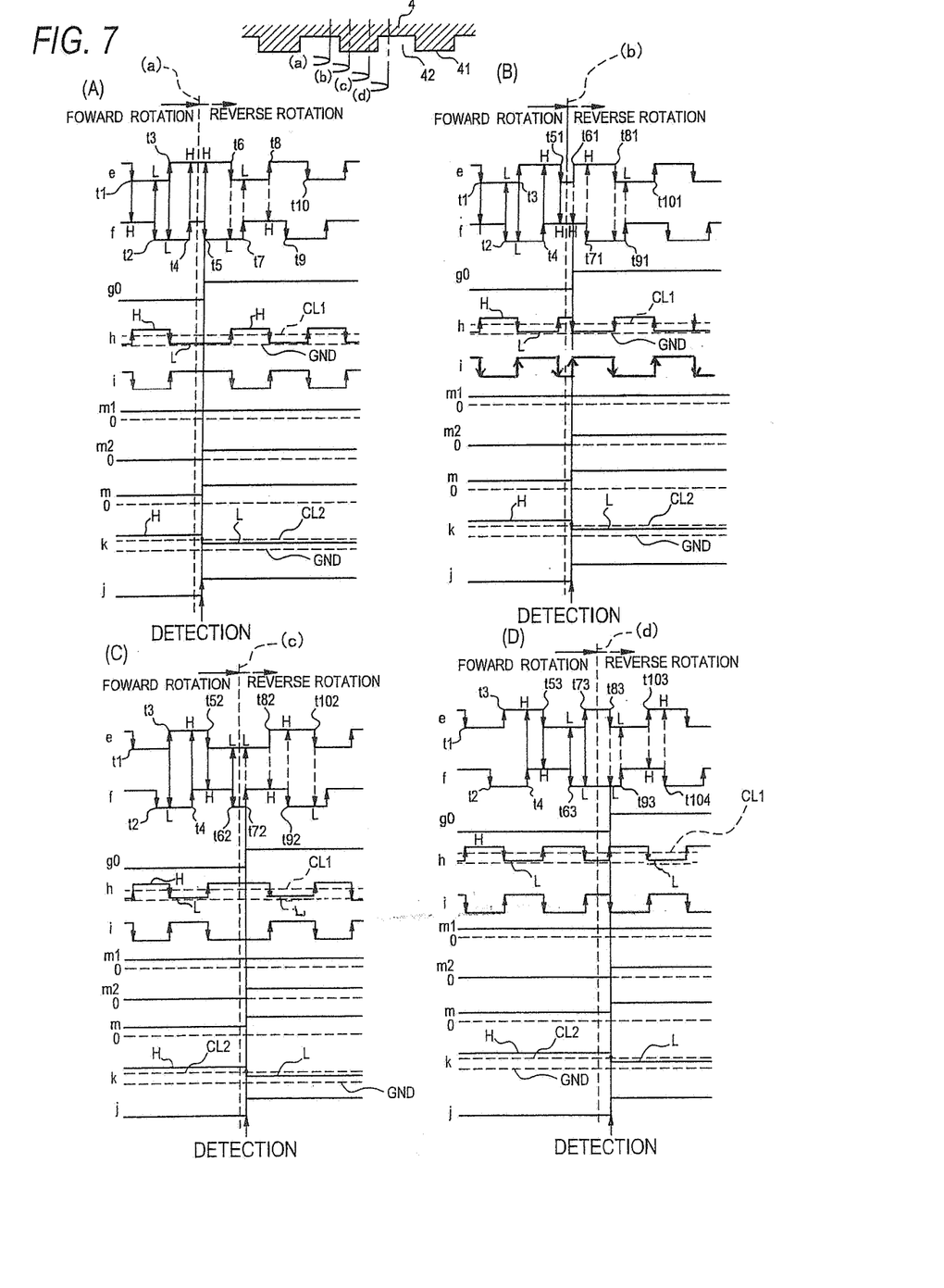
FIGS. 7A-7D are explanatory figures that explain the operation of the device according to the first embodiment of the invention.

FIGS. 7A-7D are operation explanatory figures of the magnetic sensor according to the first embodiment. FIG. 7A shows the waveforms of signals e, f, g0, h, i, j, k on the respective terminals of the circuit shown in FIGS. 6 and 4 and of a consumption current m currents m1, m2 in the case rotation is switched from forward to reverse when the magnetic movable 4 and the center MR element 22 of the magnet 1 (see FIG. 1) are relatively opposed in a position (a). Likewise, FIGS. 7B, 7C and 7D show the waveforms of signals e, f, g0, h, i, j, k and of a consumption current m, currents m1, m2 in the case rotation is switched from forward to reverse when the magnetic movable 4 and the center MR element 22 of the magnet 1 are relatively opposed in each of positions (b), (c) and (d). The signal h assumes a binary signal pulse having high and low levels H, L1 during forward rotation of the magnetic movable 4. It also assumes a binary signal pulse having high and low levels H, L2 during reverse rotation of the magnetic movable 4. Here, ground level GND<L is held as shown in FIG. 7.

The operation is now described. Referring to FIG. 7A, when the magnetic movable 4 is in a forward rotation, the MR elements 21a, 22, 21b alternately become opposite, in the order, to the convex 41 and concave 42 of the magnetic movable 4 differently in time. This provides a change of bias magnetic field to the MR elements 21a, 22, 21b, thus changing the resistance values thereof.

The resistance change of the MR element 21a, 22, 21b causes a change in the signal c, d, to be inputted to the inverted input terminal 291, 311 of the first and second comparator circuit 29, 31, into a sinusoidal waveform. When the magnetic movable 4 rotates forward, the signal c is advanced a predetermined amount of phase relative to the signal d due to a positional relationship in arrangement of the MR elements 21a, 22, 21b.

In FIG. 7A, if it is now assumed that the signal e at time t1 changes from the high to low level, the first fall-edge D-FF circuit 382 is triggered. Because the signal f, inputted to its D terminal from the second comparator circuit 31, is high in level, its Q terminal has a signal high in level. Thus, the 4-input OR circuit 342 at its output terminal 346 has a signal g high in level. Thus, the NOT circuit 347 has, at its output terminal, a signal g0 low in level.

This places the second Tr 40 in conduction, thus rendering the current m2 zero. The consumption current m is equal in value to the current m1. Because the signal e at time t1 becomes low in level, the first Tr 37 becomes non-conductive with a result that the first Tr 37 has a collector signal h high in level. The third comparator circuit 44 has a comparison level CL1 set at between the high and low levels H, L of the signal h. Accordingly, at the time t1, the third comparator circuit 44 has an output signal i low in level.

The signal k at the time t1 lies in high level H. However, the fourth comparator circuit 45 has a comparison level CL2 set at between the high and low levels H, L of the signal k. Thus, the fourth comparator circuit 45 has an output signal j staying low in level.

At time t2, the signal f, on the output terminal 313 of the second comparator circuit 31, falls from the high to low level, to cause a triggering in the second fall-edge D-FF circuit 384. The signal e, on the output terminal 293 of the first comparator circuit 29, is low in level at the time t2 so that the Q terminal has a signal low in level. However, the Q terminal of the first fall-edge D-FF circuit 382 maintains the high level, and the 4-input OR circuit 342 has an output g high in level. Accordingly, the NOT circuit 347 has, at its output terminal, a signal g0 staying low in level and the fourth comparator circuit 45 has an output signal j staying low in level.

At time t3, the signal e from the first comparator circuit 29 rises to cause a triggering in the first rise-edge D-FF circuit 381. However, because the signal f, on the output terminal 313 of the second comparator circuit 31, is low in level, the Q terminal has a signal low in level. At the time t3, the first fall-edge D-FF circuit 382 has, at its Q terminal, a signal maintained high in level, and the 4-input OR circuit 342 has, at its output terminal 346, a signal g high in level and the NOT circuit 347 has, at its output terminal, a signal g0 low in level. For this reason, the second Tr 40 stays non-conductive. Meanwhile, the first Tr 37 becomes conductive because the signal e becomes high in level and the signal h becomes a low level L.

By turning the signal h to a low level L, the third comparator circuit 44 set at a comparison level CL1 has an output signal i high in level. At the time t3, the second Tr 40 stays non-conductive and the fourth comparator circuit 45 has an output signal j saying low in level.

At time t4, when the signal f on the output terminal 313 of the second comparator circuit 31 rises to a high level, the second rise-edge D-FF circuit 383 is triggered. Because the signal on the D terminal at that time is high in level, a high-level signal is outputted from the Q terminal. Due to this, the 4-input OR circuit 342 has an output signal g continuing high in level. The NOT circuit 347 has, at its output terminal, a signal g0 maintained low in level and the second Tr 40 continues non-conductive. The signal h stays low in level L. At the time t4, there is no change in the output signals i, j of the third and fourth comparator circuits 44, 45 from those at the time t3. Namely, the signal j stays low in level.

In this manner, when the magnetic movable 4 rotates forward, the third comparator circuit 44 has an output signal i assuming a binary-signal pulse having high and low levels whereas the fourth comparator circuit 45 has an output signal j staying low in level. Namely, by the fact that the output signal i appears as a binary pulse having high and low levels while the output signal j continues low in level, it can be determined that the magnetic movable 4 is in a forward rotation.

It is now assumed that, when the magnetic movable 4 and the MR element 22 provided in the magnet 2 are in a positional relationship (a) shown in FIG. 7A, in case the magnetic movable 4 changes from the forward to reverse rotation, the signal f on the output terminal 313 of the second comparator circuit 31 changes into a low level at time t5 that the MR element 21b first becomes opposite to the convex 41 of the magnetic movable 4. Due to this, the signal g on the output terminal 346 of the 4-input OR circuit 342 changes into a low level. Thus, the signal g0 on the output terminal of the NOT circuit 347 becomes high in level.

Due to this, the second Tr 40 becomes conductive to flow a current m2, thus increasing the consumption current m. This changes the signal k, to be inputted to the inverted input terminal 451 of the fourth comparator circuit 45, from the level H to L equal to or smaller than the comparison level CL2, to change to a high level the signal j on the output terminal 453 of the fourth comparator circuit 45. Meanwhile, the signal e at time t5 is high in level so that the first Tr 37 stays conductive. Because the signal h is low in level L and equal to or smaller than the first comparison level CL1, the third comparator circuit 44 has an output signal i staying high in level.

At time t6, the signal e becomes low in level L and hence the first Tr 37 becomes non-conductive. As a result, the signal h becomes high in level H, and the output signal i of the third comparator circuit 44 turns into a low level. At the time t6, although the first fall-edge D-FF circuit 382 is triggered, the signal f at this time is low in level so that the 4-input OR circuit 342 has, at its output terminal 346, a signal g staying low in level. Hence, the NOT circuit 347 has an output signal g0 staying high in level. Accordingly, the fourth comparator circuit 45 has an output signal j staying high in level.

When the magnetic movable 4 rotates reverse, the magnetic movable 4 at its convex 41 and concave 42 alternately becomes opposite to the MR element 21b, 22 and 21a differently in time in the order, conversely to the forward rotation. At time points t8 and t10 after the time point t6, the signal i on the output terminal 443 of the third comparator circuit 44 changes alternately between low and high levels. However, the signal g on the output terminal 346 of the D-FF circuit device 380 stays low in level so that the output signal g0 of the NOT circuit 347 is maintained high in level. The second Tr 40 continues conductive and hence the consumption current m stays in an increased state.

Due to this, the signal j on the output terminal 453 of the fourth comparator circuit 45 is maintained high in level conversely to the case in forward rotation. Accordingly, in the case the magnetic movable 4 inverts in rotation in the timing of (a), the signal j changes from the low to high level at the time t5 the signal f first changes in level. From then on, the high level is continued. This makes it possible to determine a reverse rotation of the magnetic movable 4.

Likewise, in the case rotation is inverted in a positional relationship (b), the signal k becomes a low level L at the time t61 the signal e first changes, as shown in FIG. 7B. At the time t61, a reverse rotation is detected immediately. In the case rotation is inverted in a positional relationship (c), the signal k becomes a low level L at time t72 the signal f first changes, as shown in FIG. 7C. At the time t72, a reverse rotation can be detected.

In the case the magnetic movable 4 inverts in rotation in a positional relationship (d), the signal g0 changes from the low to high level at t83 the signal e first changes after the inversion, as shown in FIG. 7D. Thus, the second Tr 40 becomes conductive. This increases the consumption current m so that the signal k to the inverted input terminal 451 of the fourth comparator circuit 45 becomes equal to or lower than a second comparison level CL2, providing an output signal j thereof high in level. Thus, it is possible to detect a reverse rotation, without encountering an erroneous detection, at time point t83 the signal e first changes in level after an inversion.

As described above, the magnetic sensor in the first embodiment can detect a reverse rotation free from erroneous detections without encountering a significant delay in timing even where the magnetic movable 4 is inverted in rotation in any of opposite positions to the MR element. Meanwhile, it is possible to detect a moving speed of the magnetic movable 4 and of the object-being-detected depending upon the change period of the output signal i of the third comparator circuit 4.

Second Embodiment

Figure 8:
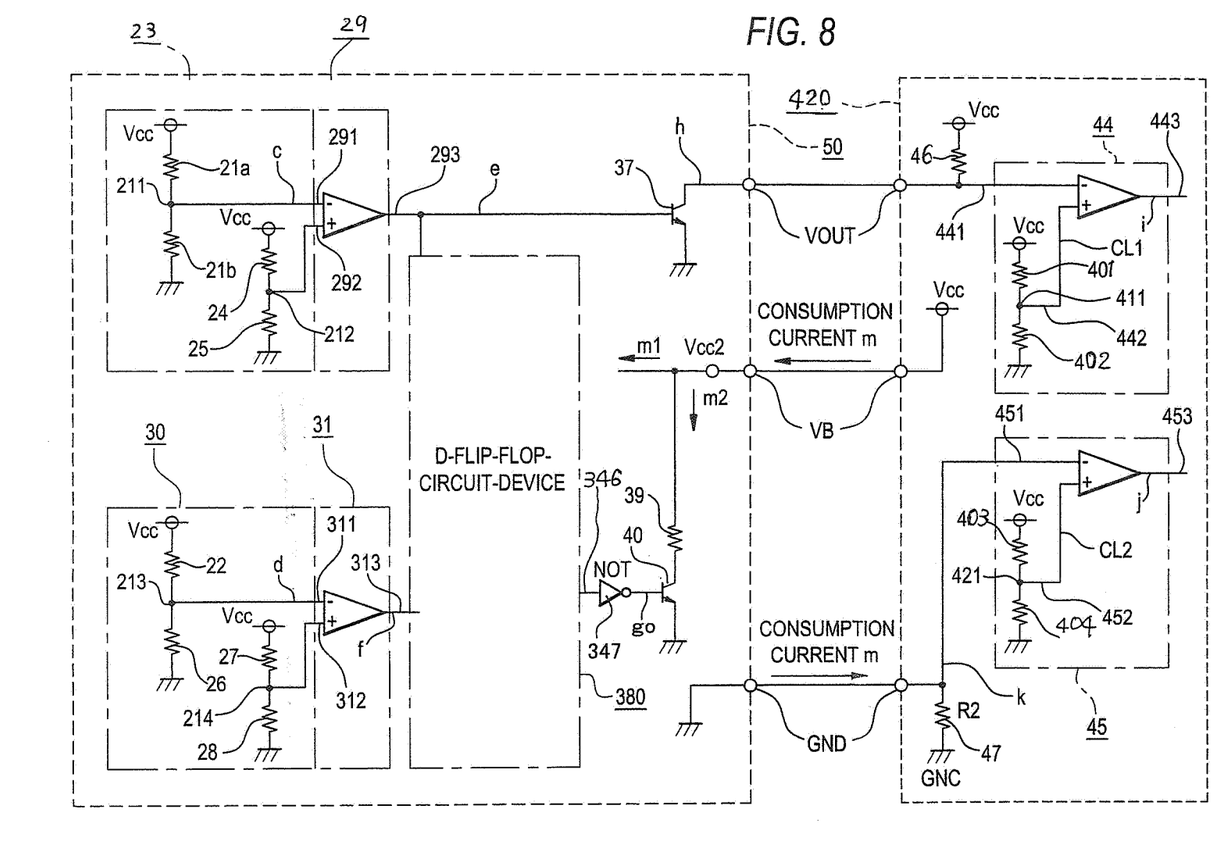
FIG. 8 is a circuit diagram of a device according to a second embodiment of the invention.

FIG. 8 shows a circuit diagram of a magnetic sensor according to a second embodiment of the invention. FIGS. 9A–9D are explanatory figures that explain the operation of the same. A second Tr 40 has an emitter grounded and a collector connected through a resistance 39 to a power terminal VB through which power voltage VCC is supplied to a sensor unit 50. The sensor unit 50 has a ground terminal GND connected to the GND of a computer unit 420 through a resistance 47. The resistance 47 is assumed to have a resistance value R2. The power voltage VCC2 on the sensor unit 50 side is a voltage that is obtained by regulating the voltage from the power terminal VB to a predetermined value and hence is free from voltage fluctuations.

The sensor unit 50 is supplied with power from the computer unit 420 through the power terminal VB so that a consumption current m flows to the sensor unit 50. The consumption current m includes a current m1 flowing to the circuit elements of the sensor unit 50 and a current m2 to be controlled by the second Tr 40. Meanwhile, the consumption current m flows from the sensor unit 50 to the computer unit 49 through the GND terminal.

The other is similar in structure to the first embodiment.

In the above arrangement, the magnetic detecting elements 21a, 21b, 22 constitute a detecting section in the invention. The first and second bridge circuits 23, 31, the first and second comparator circuits 29, 31 and the D-flip-flop circuit device 380 constitute a converting section that converts a magnetic-field change detected by the detecting section into an electric amount change and outputs it. Those are provided in the sensor unit 50. The third and fourth comparator circuits 44, 45 constitute a determining section that determines a moving direction of an object-being-detected depending upon an output of the converting section, which are provided in the computer unit 420. The second Tr 40 constitutes a current-control section that changes the current flowing to the power terminal VB and ground terminal GND correspondingly to a moving direction of the magnetic movable 4.

Furthermore, the signal e, on the output terminal 293 of the first comparator circuit 29, constitutes a first signal. The signal f, on the output terminal 313 of the second comparator circuit 31, constitutes a second signal. The signal g, on the output terminal 346 of the D-FF circuit device 380, constitutes a third signal. The signal i, on the output terminal 441 of the third comparator circuit 44, constitutes a fourth signal.

The signal j, on the output terminal 453 of the fourth comparator circuit 45, constitutes a fifth signal. In the ensuing description, those signals are referred merely to as signals e, f, g, i and j.

In the magnetic detector in the second embodiment thus configured, by rotating the magnetic movable 4 shown in FIGS. 1 and 2, resistance change takes place in the MR elements 21a, 21b, 22. By the first and second bridge circuits 23, 30, voltage changes on two systems are obtained as signals c, d. The signals c, d are changed by the first and second comparator circuits 29, 31 into rectangular waves thus obtaining signals e, f.

The signal e, of from the output terminal 293 of the first comparator circuit 29, is inputted to a base of the first Tr 37, to a CL terminal of a first rise-edge D-FF circuit 381 shown in FIG. 4 and to a CL terminal of a first fall-edge D-FF circuit 382 through a NOT circuit 343. Also, the signal e is inputted to a D terminal of a second rise-edge D-FF circuit 383 and to a D terminal of a second fall-edge D-FF circuit 384.

Meanwhile, the signal f, of from the output terminal 313 of the second comparator circuit 31, is inputted to the respective D terminals of the first rise-edge and fall-edge D-FF circuits 381, 382, to a CL terminal of the second rise-edge D-FF circuit 383 and to a CL terminal of the second fall-edge D-FF circuit 384 through a NOT circuit 344.

Figure 9:
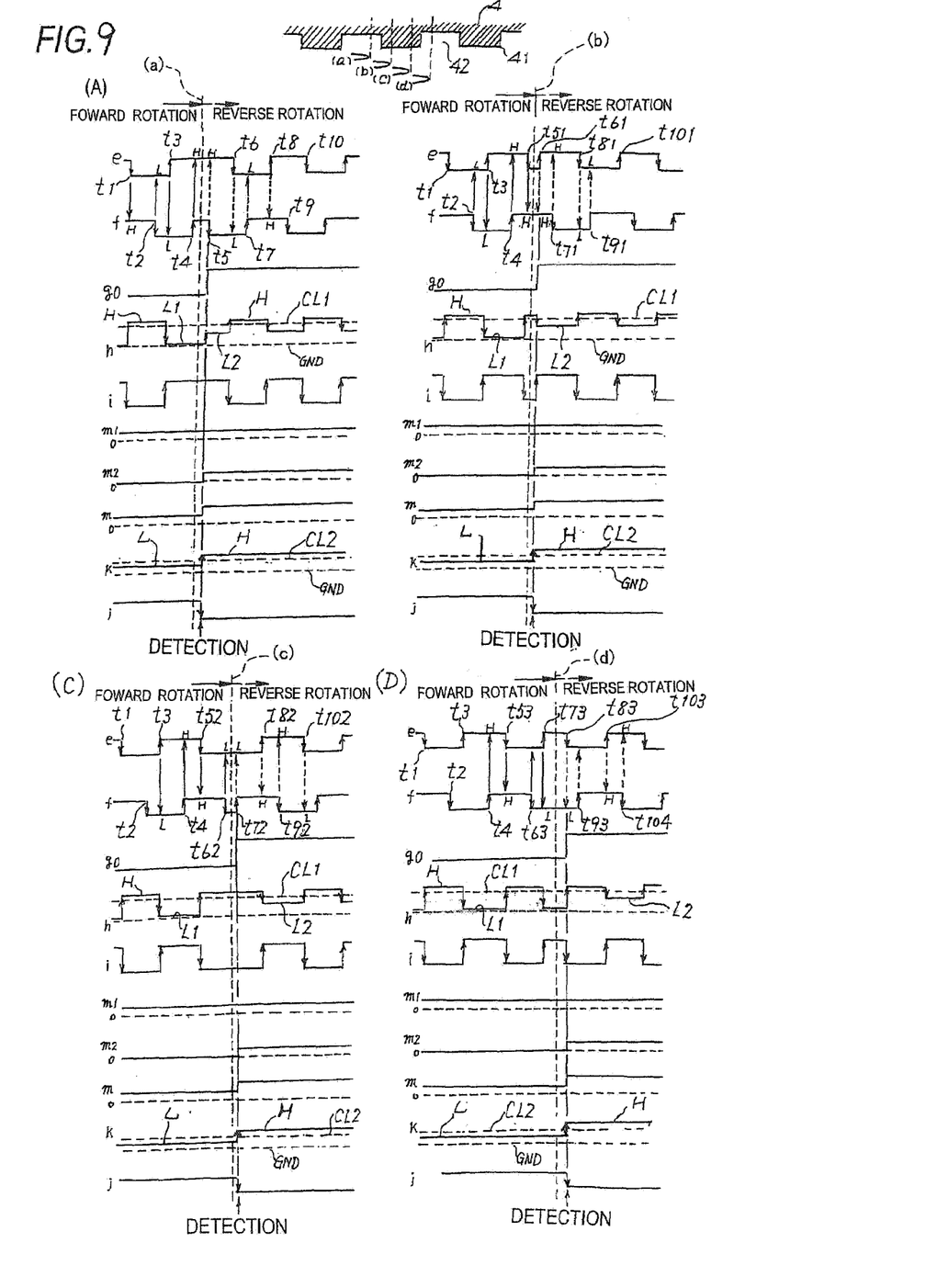
FIGS. 9A-9D are explanatory figures that explain the operation of the device according to the second embodiment of the invention.

Depending upon the signals of from the Q terminals of the respective D-FF circuits 381, 382, 383, 384, a 4-input OR circuit 342 outputs, at its output terminal 346, a signal g to be inputted to an input terminal of a NOT circuit 347. The NOT circuit 347 has an output terminal to output a signal g0. The signal h, outputted from the first Tr 37, is compared with a comparison level CL1 by the third comparator circuit 44, thus obtaining a signal i. The comparison level CL1 in the third comparator circuit 44 is set at between high and low levels H, L2 of the signal h, as shown in FIG. 9. The signal k, to be inputted to an inverted input terminal 451 of the fourth comparator circuit 45, relies upon a voltage across the resistance 47.

Namely, signal-$k$ high level $H=R2\times(m1+m2)$ signal-$k$ low level $L=R2\times m1$.

The signal k is not related to the power voltage VCC. Even in case the power voltage VCC varies, there occur no fluctuations in the signal-k high and low levels H, L. The signal k is compared with a comparison level CL2 thus obtaining a signal j as shown in FIG. 9.

FIG. 9A shows the waveforms of signals e, f, g0, h, i, j, k on the respective terminals of the circuit shown in FIGS. 8 and 4 and of consumption current m and currents m1, m2 in the case rotation is switched from forward to reverse when the magnetic movable 4 and the center MR element 22 of the magnet 1 (see FIG. 1) are relatively opposed in a position (a). Likewise, FIGS. 9B, 9C and 9D show the waveforms of signals e, f, g0, h, i, j, k and of consumption current m and currents m1, m2 in the case rotation is switched from forward to reverse when the magnetic movable 4 and the center MR element 22 of the magnet 1 are relatively opposed in each of positions (b), (c) and (d). The signal h assumes a binary signal pulse having high and low levels H, L1 during forward rotation of the magnetic movable 4. It also assumes a binary signal pulse having high and low levels H, L2 during reverse rotation of the magnetic movable 4. Here, ground level GND<L1<L2 is held as shown in FIG. 9.

The operation is now described. Referring to FIG. 9A, when the magnetic movable 4 is in a forward rotation, the MR elements 21a, 22, 21b alternately become opposite, in the order, to the convex 41 and concave 42 of the magnetic movable 4 differently in time. This provides a change of bias magnetic field to the MR elements 21a, 22, 21b, thus changing resistance values thereof.

The resistance change of the MR element 21a, 22, 21b causes a change in the signal c, d, to be inputted to the inverted input terminal 291, 311 of the first and second comparator circuit 29, 31, into a sinusoidal waveform. When the magnetic movable 4 rotates forward, the signal c is advanced a predetermined amount of phase relative to the signal d due to a positional relationship in arrangement of the MR elements 21a, 22, 21b.

In FIG. 9A, if it is now assumed that the signal e at time t1 changes from the high to low level, the first fall-edge D-FF circuit 382 is triggered. Because the signal f, inputted to its D terminal from the second comparator circuit 31, is high in level, its Q terminal has a signal high in level. Thus, the 4-input OR circuit 342 at its output terminal 346 has a signal g high in level. Thus, the NOT circuit 347 has, at its output terminal, a signal g0 low in level.

This places the second Tr 40 in non-conduction, thus rendering the current m2 zero. The consumption current m is equal in value to the current m1. Because the signal e at time t1 becomes low in level, the first Tr 37 becomes non-conductive with a result that the first Tr 37 has a collector signal h high in level. The third comparator circuit 44 has a first comparison level CL1 set at between the high and low levels H, L2 of the signal h. Accordingly, at the time t1, the third comparator circuit 44 has an output signal i low in level.

The signal k at the time t1 lies in low level L. However, the fourth comparator circuit 45 has a comparison level CL2 set at between the high and low levels H, L of the signal k. Thus, the fourth comparator circuit 45 has an output signal j staying high in level.

At time t2, the signal f, on the output terminal 313 of the second comparator circuit 31, falls from the high to low level, to cause a triggering in the second fall-edge D-FF circuit 384. The signal e, on the output terminal 293 of the first comparator circuit 29, is low in level at the time t2 so that the Q terminal has a signal low in level. However, the Q terminal of the first fall-edge D-FF circuit 382 maintains the high level, and the 4-input OR circuit 342 has an output g high in level. Accordingly, the NOT circuit 347 has, at its output terminal, a signal g0 staying low in level and the fourth comparator circuit 45 has an output signal j staying high in level.

At time t3, the signal e of from the first comparator circuit 29 rises to cause a triggering in the first rise-edge D-FF circuit 381. However, because the signal f, on the output terminal 313 of the second comparator circuit 31, is low in level, the Q terminal has a signal low in level. At the time t3, the first fall-edge D-FF circuit 382 has, at its Q terminal, a signal maintained high in level, and the 4-input OR circuit 342 has, at its output terminal 346, a signal g high in level and hence the NOT circuit 347 has an output signal g0 low in level. Accordingly, the second Tr 40 stays non-conductive. Meanwhile, the first Tr 37 becomes conductive because the signal e becomes high in level, thus making the signal h low in level L1.

By turning the signal h to the low level L1, the third comparator circuit 44 set at the comparison level CL1 has an output signal i high in level. At the time t3, the second Tr 40 stays non-conductive and the fourth comparator circuit 45 has an output signal j staying high in level.

At time t4, when the signal f on the output terminal 313 of the second comparator circuit 31 rises to a high level, the second rise-edge D-FF circuit 383 is triggered. Because the signal on the D terminal at that time is high in level, a high-level signal is outputted from the Q terminal. Due to this, the 4-input OR circuit 342 has an output signal g maintained high in level. The NOT circuit 347 has, at its output terminal, signal g0 continued low in level and the second Tr 40 continues non-conductive. At the time t4, the signal h stays low in level L1 and there is no change in the output signals i, j of the third and fourth comparator circuits 44, 45 from those at the time t3. Namely, the signal j stays high in level.

In this manner, when the magnetic movable 4 rotates forward, the third comparator circuit 44 has an output signal i assuming a binary-signal pulse having high and low levels whereas the fourth comparator circuit 45 has an output signal j staying high in level. Namely, by the fact that the output signal i appears as a binary pulse having high and low levels while the output signal j continues high in level, it can be determined that the magnetic movable 4 is in a forward rotation.

It is now assumed that, when the magnetic movable 4 and the MR element 22 provided in the magnet 2 are in a positional relationship (a) shown in FIG. 7A, in case the magnetic movable 4 changes from the forward to reverse rotation, the signal f on the output terminal 313 of the second comparator circuit 31 changes into a low level at time t5 that the MR element 21b first becomes opposite to the convex 41 of the magnetic movable 4. Due to this, the signal g on the output terminal 346 of the 4-input OR circuit 342 changes into a low level. Thus, the signal g0 on the output terminal of the NOT circuit 347 becomes high in level.

Due to this, the second Tr 40 becomes conductive to flow a current m2, thus increasing the consumption current m. This changes the signal k, to be inputted to the inverted input terminal 451 of the fourth comparator circuit 45, from the low level L to high level H equal to or greater than the comparison level CL2, to change to a low level the signal j on the output terminal 453 of the fourth comparator circuit 45. Meanwhile, the signal e at time t5 is high in level so that the first Tr 37 stays conductive. Because of the increase in the consumption current m, the signal h becomes L2 that is equal to or smaller than the first comparison level CL1. Thus, the third comparator circuit 44 has an output signal i staying high in level.

At time t6, the signal e becomes low in level and hence the first Tr 37 becomes non-conductive. As a result, the signal h becomes high in level H, to change low in level the output signal i of the third comparator circuit 44. At the time t6, although the first fall-edge D-FF circuit 382 is triggered, the signal f at this time is low in level L and the 4-input OR circuit 342 has, at its output terminal 346, the signal g maintained low in level so that the NOT circuit 347 has, at its output terminal, a signal g0 maintained high in level. Accordingly, the fourth comparator circuit 45 has an output signal j staying low in level.

When the magnetic movable 4 rotates reverse, the magnetic movable 4 at its convex 41 and concave 42 alternately becomes opposite to the MR element 21b, 22 and 21a differently in time in the order, conversely to the forward rotation. At time points t8 and t10 after the time t6, the signal i on the output terminal 443 of the third comparator circuit 44 changes alternately between low and high levels. However, the signal g on the output terminal 346 of the D-FF circuit device 380 stays low in level so that the signal g0 on the output terminal of the NOT circuit 347 is maintained high in level. The second Tr 40 continues conductive and the consumption current m stays in an increased state.

Due to this, the signal j on the output terminal 453 of the fourth comparator circuit 45 is maintained low in level, conversely to the case in forward rotation. Accordingly, in the case the magnetic movable 4 inverts in rotation in the timing of (a), the signal j changes from the high to low level at the time t5 the signal f first changes in level. From then on, the low level is continued. This makes it possible to determine a reverse rotation of the magnetic movable 4.

Likewise, in the case rotation is inverted in a positional relationship (b), the signal k becomes a high level H at the time t61 the signal e first changes, as shown in FIG. 9B. At the time t61, a reverse rotation is detected immediately. In the case rotation is inverted in a positional relationship (c), the signal k becomes a high level H at time t72 the signal f first changes, as shown in FIG. 9C. At the time t72, a reverse rotation can be detected.

In the case the magnetic movable 4 inverts in rotation in a positional relationship (d), the signal g0 changes from the low to high level at t83 the signal e first changes after the inversion, as shown in FIG. 9D. Thus, the second Tr 40 becomes conductive. This increases the consumption current m so that the signal k to the inverted input terminal 451 of the fourth comparator circuit 45 becomes a high level H equal to or greater than a second comparison level CL2, providing an output signal j thereof low in level. Thus, it is possible to detect a reverse rotation, without encountering an erroneous detection, at time point t83 the signal e first changes in level after the inversion.

As described above, the magnetic sensor in the second embodiment can detect a reverse rotation free from erroneous detections without encountering a significant delay in timing even where the magnetic movable 4 is inverted in rotation in any of opposite positions to the MR element. Meanwhile, it is possible to detect a moving speed of the magnetic movable 4 and of the object-being-detected depending upon the change period of the output signal i of the third comparator circuit 4. If considering the fluctuations of a power voltage to be supplied from the computer unit 420 to the sensor unit 50, fluctuations occur at high and low levels H, L in the signal k in the first embodiment, which comparatively makes it difficult to establish the comparison level CL2. In the second embodiment, the signal k is not related to the voltage of power source VCC. Where the voltage of power source VCC should varies, no fluctuations occur at the high and low levels H, L of the signal k. This makes it easy to set up a comparison level CL2.

What is claimed is:

1. A magnetic sensor comprising:
    a magnetic movable that moves correspondingly to a movement of an object-being-detected;
    a sensor section provided opposite to the magnetic movable through a gap and for detecting a change of magnetic field in the gap based on a movement of the magnetic movable;
    a converting section that converts a change of magnetic field, detected by the sensor section, into an electric amount change and outputs an electric amount change converted;
    in a sensor unit having a power terminal and a ground terminal for grounding, and an output terminal;
    a determining section that determines a moving direction of the object-being-detected depending upon an output of the converting section through the output terminal of the sensor unit;
    a current control section that controls an amount of current flowing through at least one of the power terminal and the ground terminal correspondingly to a moving direction of the magnetic movable;
    the determining section detecting a moving direction of the object-being-detected depending upon the amount of current.

2. A magnetic sensor according to claim 1, wherein the determining section is configured to detect a moving speed of the object-being-detected depending upon an output of the converting section, and to detect a moving direction of the object-being-detected depending upon the amount of current.

3. A magnetic sensor according to claim 1, wherein the detecting section has a plurality of detecting elements arranged parallel along a moving direction of the magnetic movable, the converting section having a first comparing section that generates a first signal correspondingly to a detection of the change of magnetic flux due to a detecting element in a part of the plurality of detecting elements, a second comparing section that generates a second signal correspondingly to a detection of the change of magnetic flux due to another detecting element of the plurality of detecting elements, and a circuit device that outputs a third signal changing depending upon the first and second signals, the determining section having a third comparing circuit that generates a fourth signal changing depending upon the first signal and a fourth comparing circuit that generates a fifth signal changing depending upon the amount of current, thereby detecting a moving direction of the object-being-detected depending upon the fifth signal.

4. A magnetic sensor according to claim 3, wherein the current control section is configured by a switching section to be controlled depending upon the third signal of from the circuit device connected between the power terminal and the ground.

5. A magnetic sensor according to claim 3, wherein the circuit device has a D-flip-flop circuit device that generates the third signal changing correspondingly to a state of the first and second signals as inputs.

6. A magnetic sensor according to claim 3, wherein circuit device has a first rise-edge D-flip-flop circuit to be triggered by a rise edge of the first signal, a second rise-edge D-flip-flop circuit to be triggered by a rise edge of the second signal, a first fall-edge D-flip-flop circuit to be triggered by a fall edge of the first signal, a second fall-edge D-flip-flop circuit to be triggered by a fall edge of the second signal.

* * * * *